United States Patent [19]

Miyazawa et al.

[11] Patent Number: 4,893,157
[45] Date of Patent: Jan. 9, 1990

[54] SEMICONDUCTOR DEVICE

[75] Inventors: Kazuyuki Miyazawa, Kodaira; Yasunori Yamaguchi, Tachikawa; Hiroshi Kawamoto, Kodaira, all of Japan

[73] Assignee: Hitachi, Ltd., Tokyo, Japan

[21] Appl. No.: 136,939

[22] Filed: Dec. 23, 1987

Related U.S. Application Data

[63] Continuation of Ser. No. 764,072, Aug. 9, 1985, abandoned.

[30] Foreign Application Priority Data

Aug. 24, 1984 [JP] Japan ................................ 59-174947

[51] Int. Cl.⁴ ..................... H01L 29/78; H01L 27/02; H01L 29/72
[52] U.S. Cl. .................................. 357/23.13; 357/13; 357/23.4; 357/23.8; 357/35; 357/41; 357/43; 357/51
[58] Field of Search .................... 357/23.13, 23.8, 23.4, 357/13, 41, 43, 51, 89, 35

[56] References Cited

U.S. PATENT DOCUMENTS

| | | | |
|---|---|---|---|
| 3,712,995 | 1/1973 | Stendel | 357/13 |
| 3,967,295 | 6/1976 | Stewart | 357/23.13 |
| 4,100,561 | 7/1978 | Ollendorf | 357/43 |
| 4,143,391 | 3/1979 | Suzuki et al. | 357/43 |
| 4,264,941 | 4/1981 | London | 357/13 |
| 4,342,045 | 7/1982 | Kim | 357/23.13 |
| 4,400,711 | 8/1983 | Avery | 357/43 |
| 4,476,476 | 10/1984 | Yu et al. | 357/13 |
| 4,509,067 | 4/1985 | Minami et al. | 357/13 |
| 4,527,213 | 7/1985 | Ariizumi | 357/23.13 |
| 4,656,492 | 4/1987 | Sunami et al. | 357/23.4 |
| 4,733,285 | 3/1988 | Ishioka et al. | 357/23.13 |

FOREIGN PATENT DOCUMENTS

| | | | |
|---|---|---|---|
| 0123936 | 7/1984 | European Pat. Off. | 357/23.8 |
| 54-140481 | 10/1979 | Japan | 357/23.13 |
| 54-159188 | 12/1979 | Japan | 357/23.13 |
| 55-72081 | 5/1980 | Japan | 357/23.13 |
| 55-108771 | 8/1980 | Japan | 357/23.13 |
| 56-35470 | 4/1981 | Japan | 357/23.13 |
| 57-190360 | 11/1982 | Japan | 357/23.13 |
| 58-14562 | 1/1983 | Japan | 357/23.13 |
| 58-182861 | 10/1983 | Japan | 357/23.13 |
| 60-15973 | 1/1985 | Japan | 357/23.13 |
| 2090701 | 7/1982 | United Kingdom | 357/23.13 |

Primary Examiner—Andrew J. James
Assistant Examiner—Ngan Van Ngo
Attorney, Agent, or Firm—Antonelli, Terry & Wands

[57] ABSTRACT

A protective circuit consisting of a resistor and MOSFET in a diode form and a switching element are connected to a bonding pad in order to prevent destruction of an internal circuit consisting of one or more MOSFETs. The switching element may consist of a parasitic MOSFET whose source and drain regions are formed by well regions. One of the well regions is connected to a semiconductor region as a guard ring.

33 Claims, 7 Drawing Sheets

SEMICONDUCTOR DEVICE

This is a continuation of application Ser. No. 764,072, filed August 9, 1985 now abandoned.

BACKGROUND OF THE INVENTION

This invention relates generally to a semiconductor device, and more particularly to a technique which is effective when applied to an input protective circuit of a semiconductor device.

DESCRIPTION OF THE PRIOR ART

An input protective circuit (an electrostatic destruction prevention circuit) is disposed between an input bonding pad and an input terminal of an internal circuit in order to protect an integrated circuit formed on a semiconductor substrate from an external surge voltage from outside a semiconductor device.

The input protective circuit sequentially reduces the value of external surge voltage coming into the bonding pad by a protective resistor consisting of an N+ type semiconductor region and a clamping MOSFET. In this manner, the input protective circuit restricts the voltage applied to the gate electrode of the MOSFET at the input portion of the internal circuit below a voltage which would destroy the gate insulation film. A reverse breakdown voltage of the junction between the N+ type semiconductor region forming the protective resistor and the semiconductor substrate is about 25 V and the surface breakdown voltage of the clamping MOSFET is from about 10 to about 20 V. Therefore, the voltage applied to the gate electrode of the input MOSFET is below about 30 V which is the voltage which will destroy the gate insulation film. In other words, the internal circuit is not destroyed by the external surge voltage.

Since the external surge voltage is directly applied to the input protective circuit as described above, the voltage which will destroy the input protective circuit must be sufficiently high.

For details of the input protective circuit, refer, to "Nikkei Electronics", Jan. 31, 1983, p. 138, published by Nikkei-McGraw Hill Co.

SUMMARY OF THE INVENTION

The inventors of the present invention have found that the voltage which will destroy the input protective circuit can be increased by increasing the voltage necessary to destroy the junction at a part at which the input bonding pad is connected to a semiconductor protective resistor. As a result of further studies, however, the inventors have found that if the voltage which will destroy the input contact portion is increased, the energy of the external surge voltage (current) flows into the semiconductor region that constitutes the protective resistor because it is cut off from escape, and eventually destroys the protective resistor. To transfer the energy from the input contact portion to other regions, the inventors attempted to form a parasitic MOSFET at the input contact portion. In this case, however, there occurs a new problem that the parasitic MOSFET itself is likely to undergo destruction caused by a large current flowing therethrough.

It is therefore an object of the present invention to provide a semiconductor device which can better resist destruction by energy applied thereto from outside.

It is another object of the present invention to provide a semiconductor device which can transfer external energy applied to an input protective circuit from outside the input protective circuit without causing the destruction of circuit elements.

These and other objects and novel features of the present invention will become more apparent from the following description to be taken in conjunction with the accompanying drawings.

The following is a typical example of the present invention.

A switching element such as a lateral transistor or a MOSFET (gate insulated type field effect transistor) is connected to a bonding pad. The collector or emitter region or the source or drain region of these transistors comprises a semiconductor region which is deeper than the source or drain region of a MOSFET constituting an internal circuit and has a lower impurity concentration than the latter. The collector or emitter region or the source or drain region prevents the destruction of the resistor of the input protective circuit and also the destruction of the lateral transistor or MISFET as the switching element.

DESCRIPTION OF THE PREFERRED EMBODIMENTS

Figure 1:
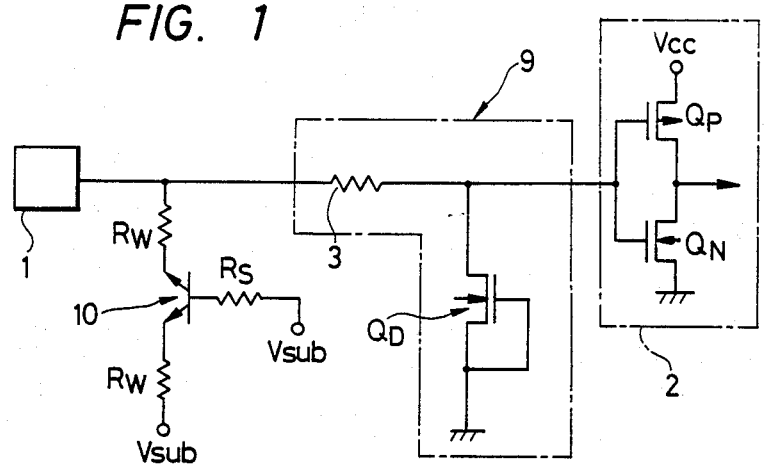
FIG. 1 is an equivalent circuit diagram of an input protective circuit in accordance with an embodiment of the present invention.
Figure 2:
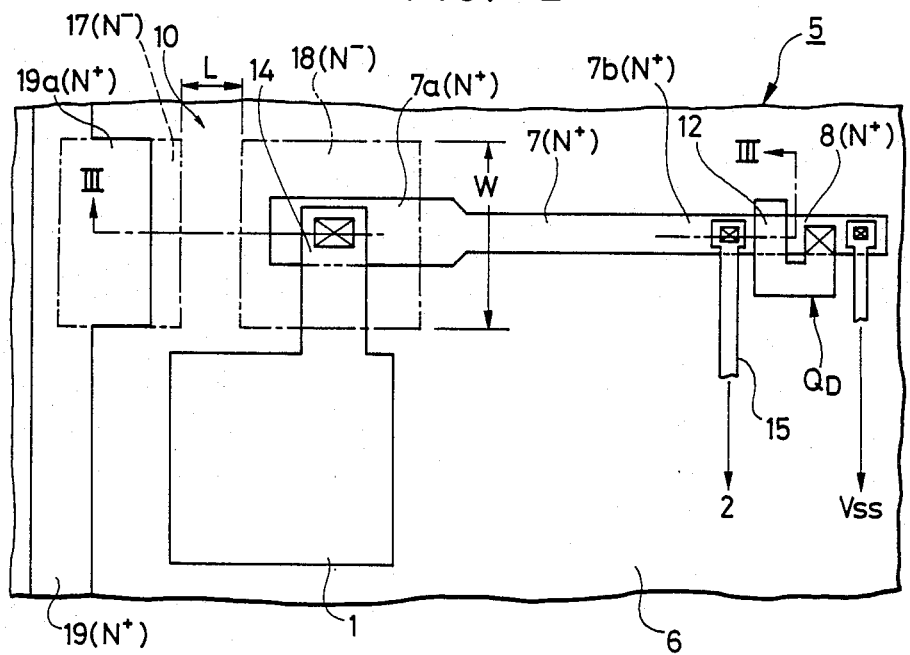
FIG. 2 is a plan view showing schematically the layout of the input protective circuit shown in FIG. 1.
Figure 3A:
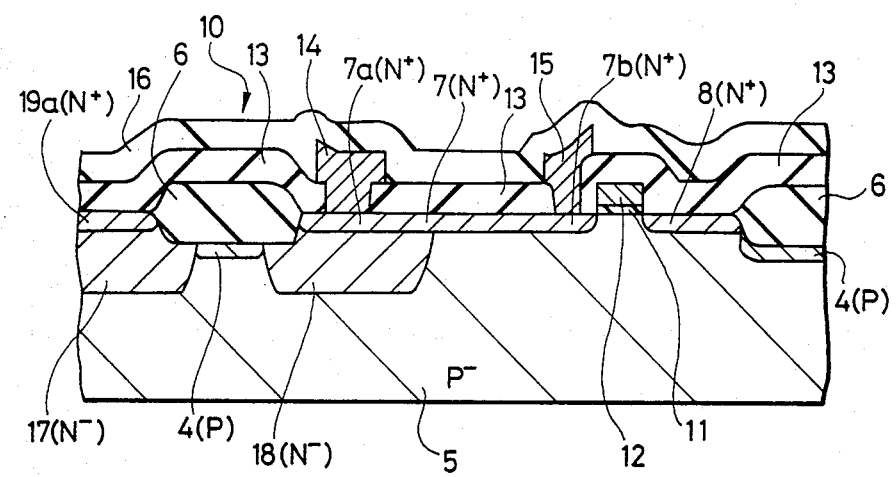
FIG. 3A is a sectional view taken along line III—III of FIG. 2.

A first embodiment of the semiconductor device of this invention will be described with reference to FIGS. 1 through 3B. FIG. 1 is an equivalent circuit diagram of the first embodiment; FIG. 2 is its plan view; and FIG. 3A is a sectional view taken along line III—III of FIG. 2.

In FIG. 1, reference numeral 1 represents an input bonding pad of an input signal source. An internal circuit 2 consists of a complementary MIS circuit comprising an N-channel MOSFET $Q_N$ and a P-channel MOSFET $Q_P$. FIG. 1 shows only the input stage of the internal circuit 2 with the other stages being omitted.

An input protective circuit 9 and a parasitic lateral transistor 10 are disposed between the bonding pad 1 and the internal circuit 2.

The input protective circuit 9 comprises a resistor 3 and a MOSFET $Q_D$ which is connected in diode form. One of the ends of the resistor 3 is connected to the bonding pad 1, and the other is connected to the gate electrodes of MOSFETs $Q_P$ and $Q_N$. MOSFET $Q_D$ is connected between the other end of the resistor 3 and the ground potential of the circuit. This transistor $Q_D$ functions as a voltage clamping diode.

The parasitic lateral transistor 10 is connected between the bonding pad 1 and the substrate. Symbols $R_W$ and $R_S$ represent the resistance of a well region forming the parasitic transistor 10 and that of the semiconductor substrate. $V_{sub}$ represents the potential of the substrate. While the semiconductor device is in operation, this $V_{sub}$ is held at the ground potential $V_{ss}(=0\text{ V})$ of the circuit or at a substrate bias voltage $V_{BB}$ $(=-2.5 \sim -3.0 \text{ V})$. When the semiconductor device is out of operation or before it is packaged actually, $V_{sub}$ is in the floating state.

The protective circuit 9 and the parasitic lateral transistor 10 are formed in such a manner as shown in FIGS. 2 and 3A.

A field insulation film 6 comprising a thick (e.g. 9,000 Å) SiO$_2$ film is formed on the surface of the semiconductor substrate 5 made of a P$^-$ type silicon single crystal. The field insulation film 6 defines a region (an active region) in which circuit elements such as MOSFETs and resistors are to be formed. A P type semiconductor region 4 as a channel stopper is formed below the field insulation film 6. N$^+$ type semiconductor regions 7 and 8 are formed by ion implantation of arsenic ions using the gate electrode 12 of MOSFET $Q_D$ comprising polysilicon and the field insulating film 6 as the implantation mask. The shape of MOSFET $Q_D$ is shown only schematically.

Reference numeral 11 represents a gate insulation film comprising an SiO$_2$ film. The N$^+$ type semiconductor region 7 forms the resistor 3 shown in FIG. 1. The region 7a on one end side of the N$^+$ type semiconductor region 7 serves as an input contact portion (the contact part between the pad 1 and the resistor 3), and the region 7b on the other side serves as the drain region of clamping MOSFET $Q_D$. The N$^+$ type semiconductor region 8 is the source region of clamping MOSFET 4. The resistor 3 is formed simultaneously with the source or drain region of MOSFET $Q_D$. The gate electrode 12 is directly connected to the semiconductor region 8 as shown in FIG. 2.

N$^-$ type well regions 17 and 18 are formed in advance by ion implantation and diffusion of phosphorus in a predetermined region of the semiconductor substrate 5 before the formation of the field insulating film 6. As will be described below, the P-channel MOSFET $Q_P$ is formed inside the well region, which is in turn formed in the semiconductor substrate, simultaneously with the formation of the well regions 17 and 18. The sheet resistance of these well regions 17, 18 is about several kilohms per square. A thick, e.g., 9,000 Å, field insulation film 6 is formed on the surface of the semiconductor substrate between both well regions 17, 18. N$^+$ type semiconductor regions 19a and 7a which have the same conductivity type as that of the well regions 17, 18 but have a higher impurity concentration than that of the well regions 17, 18 are respectively formed on the surface of both well regions 17, 18. An input contact portion 7a of the semiconductor region 7 (the resistor 3) is formed in the well region 18. In other words, a part of the resistor 3 is comprised of the regions 7a and 18. The N$^+$ type semiconductor region 19a is formed in the well region 17. This semiconductor region 19a is formed by partially projecting an N$^+$ type semiconductor region 19 as a guard ring that is formed around the outer periphery of the semiconductor chip. The semiconductor regions 19 and 19a are formed simultaneously with the source or drain region of MOSFET $Q_D$.

The collector or emitter region of the parasitic bipolar transistor 10 comprises the N$^-$ type semiconductor region 17 or 18, and its base region comprises the P type semiconductor substrate 5 and the P type channel stopper 4. The well regions 17 and 18 face parallel to each other with a predetermined distance L between them which distance corresponds to the base width. The opposing length W of both well regions 17, 18 must be a predetermined length in order to avoid current concentration at the time of the operation of the parasitic bipolar transistor 10. The N$^+$ type semiconductor regions 7a and 19a are encompassed by the N$^-$ type well regions 17 and 18, respectively. The well region 18 encompasses a considerable portion of the semiconductor region 7. This is to prevent the current concentration upon the junction of the portion by keeping the voltage drop inside the resistor 3 relatively slight, by increasing the breakdown voltage. $R_w$ is determined primarily by the resistance of both well regions 17, 18. The semiconductor region 19 is held at the potential of the substrate $V_{sub}$.

Figure 3B:
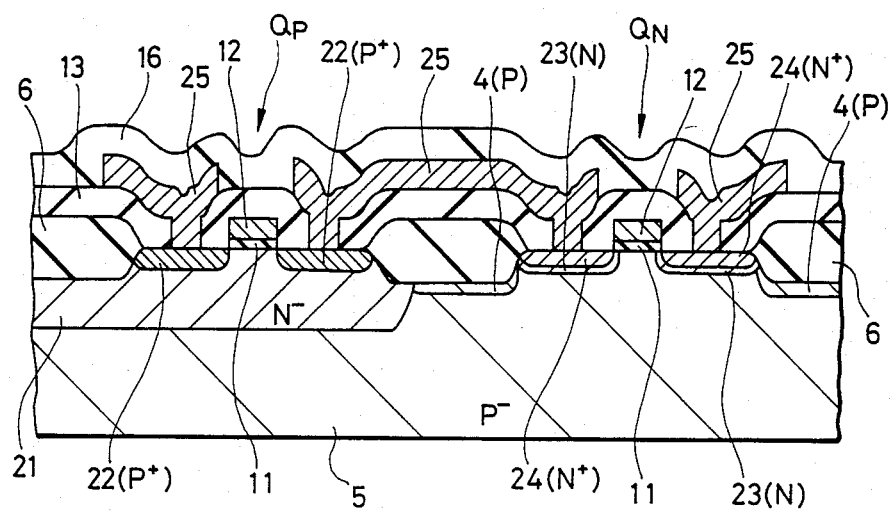
FIG. 3B is a sectional view showing the structure of an internal circuit.

The N-channel and P-channel MOSFETs $Q_N$ and $Q_P$ comprising the internal circuit 2 are formed as shown in FIG. 3B.

MOSFET $Q_P$ is formed in the N$^-$ type well region 21. The well region 21 is formed at the same production step as the well regions 17 and 18. These well regions 17, 18 and 21 are formed, by example, by implanting P ions at 125 keV and $8 \times 10^{12}$ atoms/cm$^2$. MOSFET $Q_P$ has P$^+$ source and drain regions that are formed by implanting boron ions using the gate electrode 12 (and the field insulation film 6) as the mask.

MOSFET $Q_N$ has a double-drain structure comprised of N region 23 and N$^+$ region 24 in order to prevent the occurrence of hot carriers. The N type semiconductor region 23 is formed by ion implantation of phosphorus at 50 keV and $1 \times 10^{14}$ atoms/cm$^2$ using the gate electrode 12 as the mask. The N$^+$ type semiconductor region 24 is formed by ion implantation of arsenic at 80 keV and $5 \times 10^{15}$ atoms/cm$^2$ using the gate electrode 12 as the mask. The semiconductor region 23 has a lower impurity concentration than the semiconductor region 24, and covers the latter 24.

The source and drain regions of N-channel MOSFET constituting the internal circuit comprises semiconductor regions 23 and 24. The MOSFET and the resistor constituting the protective circuit 9 comprises the N$^+$ type semiconductor regions 7 and 8 that are formed in the same production process as the semiconductor region 24. This is to keep the breakdown voltage at the p-n junction inside the protective circuit 9 lower than that of the internal circuit 2. In this manner, the voltage applied to the internal circuit 2 is reduced.

The semiconductor regions 19 and 19a are formed in the same production process as the semiconductor region 24. However, these semiconductor regions 19 and 19a may be formed by two semiconductor regions that are formed by the same production process as the semiconductor regions 23 and 24.

Reference numeral 13 represents an inter-layer insulation film which comprises, for example, 8,000 Å thick phosphosilicate glass (PSG). Reference numerals 14, 15 and 25 represent aluminum wirings which are formed simultaneously with the aluminum bonding pad 1. The wiring 14 is used for the ohmic contact of the bonding pad 1 with the input contact portion 7a. The wiring 15 is connected to MOSFETs $Q_P$ and $Q_N$ of the input stage of the internal circuit (not shown). The N+ type semiconductor region 19 is connected to the same potential as the substrate by an aluminum wiring not shown. As partially illustrated in FIG. 9, the semiconductor region 19 is a guard ring which is formed throughout the entire periphery of the semiconductor chip. Since its area is great, the guard ring 19 has sufficient capacity to absorb the energy of a surge voltage (current) from the bonding pad 1. Reference numeral 16 represents a final protection film comprising a silicon nitride film that is formed by plasma CVD. The insulation films 11, 13 and 16 are omitted in FIG. 2.

In accordance with this embodiment, the input bonding bad 1 is connected to the N+ type semiconductor region 7 (7a), and the N− type well region 18 is formed below this N+ type semiconductor region 7a. Therefore, a well region having a low impurity concentration exists below the semiconductor region connected to the input bonding pad, so that the breakdown voltage (with respect to the p-n junction with the substrate) can be improved. In other words, the p-n junction breakdown voltage can be improved to about 100 V at the input contact portion 7a.

Second, in accordance with this embodiment, the lateral NPN bipolar transistor is formed by one of the well regions 18, the other well region 17 and the semiconductor substrate 5. The well regions 17, 18 of this transistor having a lower impurity concentration function as current limiting resistors. Therefore, even when a large current flows abruptly, the well regions prevent destruction and can remove the energy of the external surge voltage from the input bonding pad. In other words, the breakdown voltage at the input contact portion is increased, and the energy of the external surge voltage can be transferred. As a result, the voltage which causes destruction can be increased.

When excessive energy (the electrostatic energy) such as an external surge voltage is applied from outside IC to the bonding pad 1, the embodiment functions in the following manner.

First of all, the case where a positive voltage is applied to the bonding pad 1 will be described.

The energy from outside passes through the input contact portion 7a and enters the semiconductor region 7. The voltage drop is smaller at those portions inside the semiconductor region 7 which are closer to the input contact portion 7a, so that a potential difference is great between the semiconductor substrate 5 and the semiconductor region 7. Since such a portion is encompassed by the well region 18, its breakdown voltage is improved to about 100 V. Therefore, the destruction of the resistor 3 close to the input contact portion 7a, that is, junction destruction due to the current concentration at the time of breakdown, can be prevented. The voltage which has dropped to a certain extent inside the region 7 covered with the well region 18 is applied to MOSFET $Q_D$ and to the remaining portion of the resistor 3.

The surface breakdown voltage of MOSFET $Q_D$ is from about 10 to 20 V while that of the junction between the resistor 3 (the portion not covered with the well region 18) and the substrate 5 is about 30 V. Therefore, MOSFET $Q_D$ first undergoes breakdown and then, the p-n junction as a part of the resistor 3. As a result, a part of the external energy is absorbed by the protective circuit 9 and is then absorbed by the substrate 5.

The energy absorbed by the substrate 5 flows through the substrate as a current. In other words, it is a base current of the parasitic lateral transistor 10. Since the resistance of the substrate 5 is as great as from 9 to 10 $10^6$ ·cm, the junction between the substrate 5 and the well region 17 is forwardly biased when the substrate current exceeds a pre-determined level. In other words, the base-emitter junction (B-E) is forwardly biased, and the lateral transistor 10 is therefore conductive. The surge voltage at this time is about 100 V. The resistance of the well regions 17, 18 as the current limiting resistors limits the current so that excessive transient current does not flow when the transistor 10 becomes conductive.

As described above, the positive surge voltage is absorbed by MOSFET $Q_D$, the resistor 3 and the lateral transistor 10. A part of the positive surge voltage is absorbed by the substrate 5, and its major portion is absorbed by the semiconductor region 19 through the lateral transistor 10 after it becomes conductive. Since the area of the semiconductor region 19 is great and the energy is dispersed, the surge voltage can be absorbed sufficiently.

Next, the case where a negative surge voltage is applied to the bonding pad 1 will be described.

In this case, the lateral transistor 10 does not operate. MOSFET $Q_D$ in the diode form and the p-n junction between the resistor 3 and the substrate 5 are forwardly biased, respectively. As a result, a current flows from the substrate 5 to the bonding pad 1 through MOSFET $Q_D$ and the resistor 3.

In accordance with this embodiment, the lateral transistor 10 is provided in addition to the protective circuit 9, so that the destruction of the semiconductor device due to a negative external surge voltage can be prevented.

Since the component of the surge voltage that flows through the substrate is less, the embodiment is effective for preventing latch-up of a complementary MOS circuit.

If a surge voltage is in a range of dozens of volts, the protective circuit 9 alone can sufficiently absorb its energy.

If the surge voltage is extremely great, the existence of the P type channel stopper 4 does not greatly affect the operation of the lateral transistor 10. The channel stopper 4 is formed, for example, by the ion implantation of boron at 60 keV and $1 \times 10^{13}$ atoms/cm$^2$.

Figure 4:
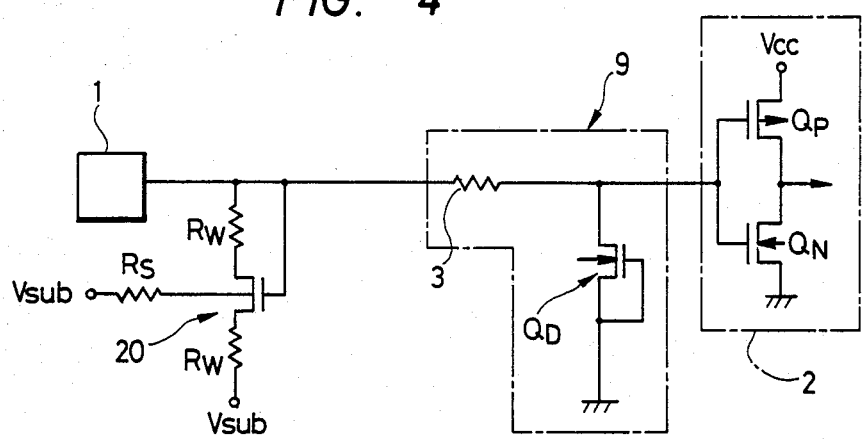
FIG. 4 is an equivalent circuit diagram of another embodiment of the present invention.
Figure 5:
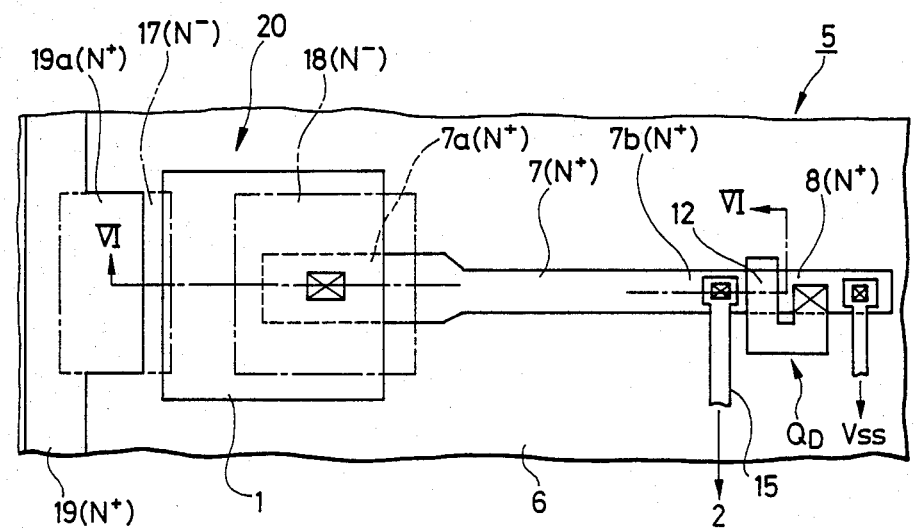
FIG. 5 is a plan view showing the layout of the embodiment shown in FIG. 4.
Figure 6:
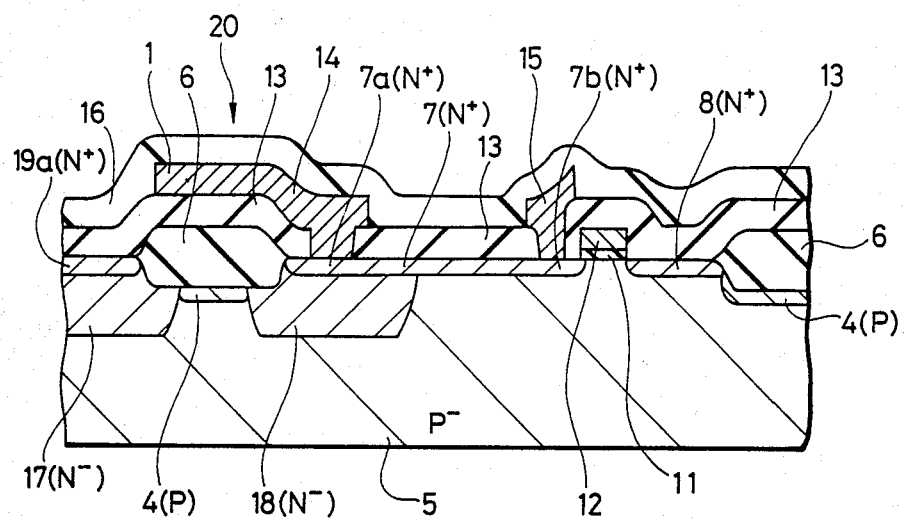
FIG. 6 is a sectional view taken along line IV—VI of FIG. 5.

FIGS. 4 through 6 show the second embodiment of the present invention. FIG. 4 is an equivalent circuit diagram of the second embodiment; FIG. 5 is a plan view thereof and FIG. 6 is a sectional view taken along line VI—VI of FIG. 5. Insulation films 11, 13 and 16 are omitted in FIG. 5.

The difference between the second embodiment and the first embodiment is that the input bonding pad 1 extends on the inter-layer insulation film 13 between the well regions 17 and 18 and on the field insulation film 6. Since the remainder of this embodiment is the same as the first embodiment, like reference numerals are used to identify like members and an explanation is omitted.

As shown in FIGS. 5 and 6, a part of the input bonding pad 1 is disposed on the field insulation film 6 and the inter-layer insulation film 13 between the well regions 17, 18 and the substrate 5. Therefore, there is formed a parasitic MOSFET 20 whose source and drain regions comprise the well regions 17, 18 and whose gate insulation film comprise the insulation films 6, 13 and which has the bonding pad 1.

Generally, the threshold voltage of parasitic MOSFETs is as low as from 10 to 20 volts. However, the threshold value of MOSFET 20 is as high dozens of volts. Furthermore, the resistance $R_w$ of the well regions 17, 18 is connected in series with MOSFET 20 as a resistor of from dozens to hundreds of ohms. Therefore, when the voltage is low such as 10–20 volts a strong current does not flow to destroy the parasitic MOSFET.

As a result of intensive experiments with this embodiment, the inventors found that the operation of the parasitic lateral transistor 10 affected the magnitude of the current from the well region 17 to 18 more than the operation of MOSFET 20 did.

It can be understood that the semiconductor device of this embodiment raises the breakdown voltage at the input contact portion from the input bonding pad to the semiconductor device, and releases the energy of the external surge voltage applied to the input contact portion through the switching element (the parasitic lateral NPN transistor or the parasitic MOSFET) equipped at its both ends with the series resistor (the well regions 17, 18). Therefore, the destruction of the protective resistor can be avoided.

The present invention provides the following effects.

(1) The switching element is connected between the bonding pad and the semiconductor chip connected directly to the bonding pad. This switching element causes the energy from the bonding pad to flow through different portions from the semiconductor chip. Therefore, the destruction of the semiconductor chip can be prevented.

(2) The resistors are inserted in series between the switching element and the bonding pad and between the switching element and the fixed potential or the substrate potential, respectively. Therefore, the current at the time of turn-on of the switching element can be limited, and the destruction of the switching element can be prevented.

(3) The switching element consists of regions having a lower impurity concentration than the regions forming the source and drain of MOSFETs of the internal circuit 2. Therefore, the breakdown voltage of the switching element itself can be improved.

(4) Due to the same construction as described in the item (3) above, the conduction voltage of the switching element can be set to a high voltage of dozens of volts.

(5) Due to the same construction as described in the item (3) above, a part of the resistor connected in series with the switching element can be formed by utilizing a low concentration region without forming it as an independent element.

(6) Since the switching element can be formed with the well regions for forming MOSFETs, it can be formed without substantially increasing any production process.

(7) Since the switching element is formed by use of a parasitic semiconductor element, it need not be formed as an independent element.

(8) Since one of the terminals of the switching element is connected to the guard ring encompassing the outer periphery of the semiconductor chip, the current flowing through the switching element can be sufficiently absorbed.

(9) The characteristics of the switching element can be controlled by forming the switching element with the parasitic bipolar transistor 10 and controlling the width of its base region.

(10) The characteristics of the switching element can be controlled by forming the switching element by use of the parasitic MOSFET and controlling its threshold voltage and surface breakdown voltage.

Although the present invention has thus been described with reference to two preferred embodiments thereof, the present invention is not particularly limited thereto and can be modified in various ways without departing from the scope thereof.

Figure 7:
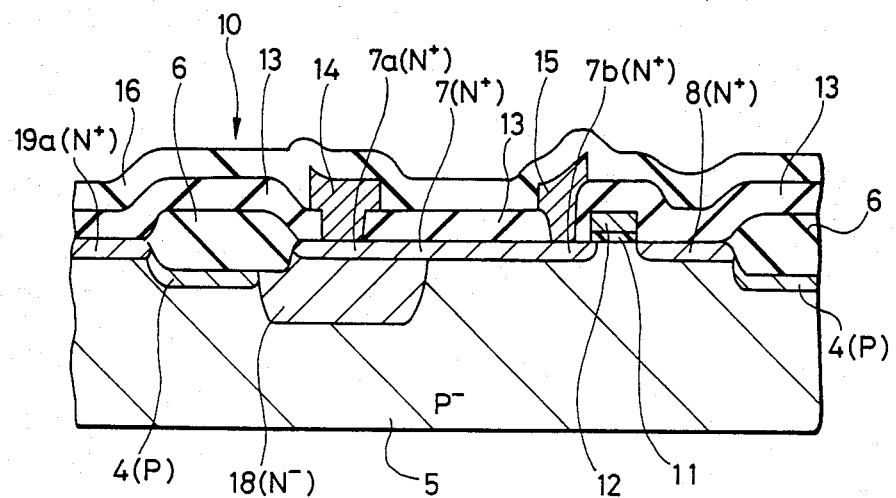
FIGS. 7 and 8 are sectional views showing other embodiments of the invention, respectively.
Figure 8:
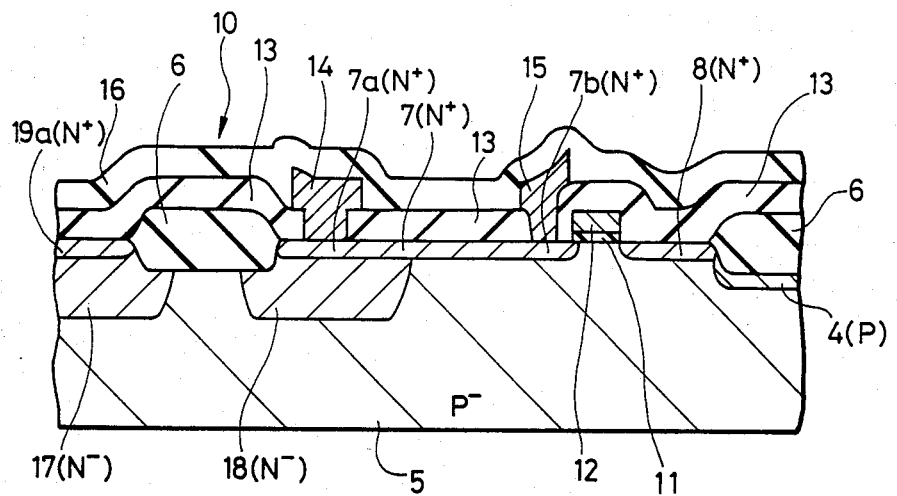
Figure 9:
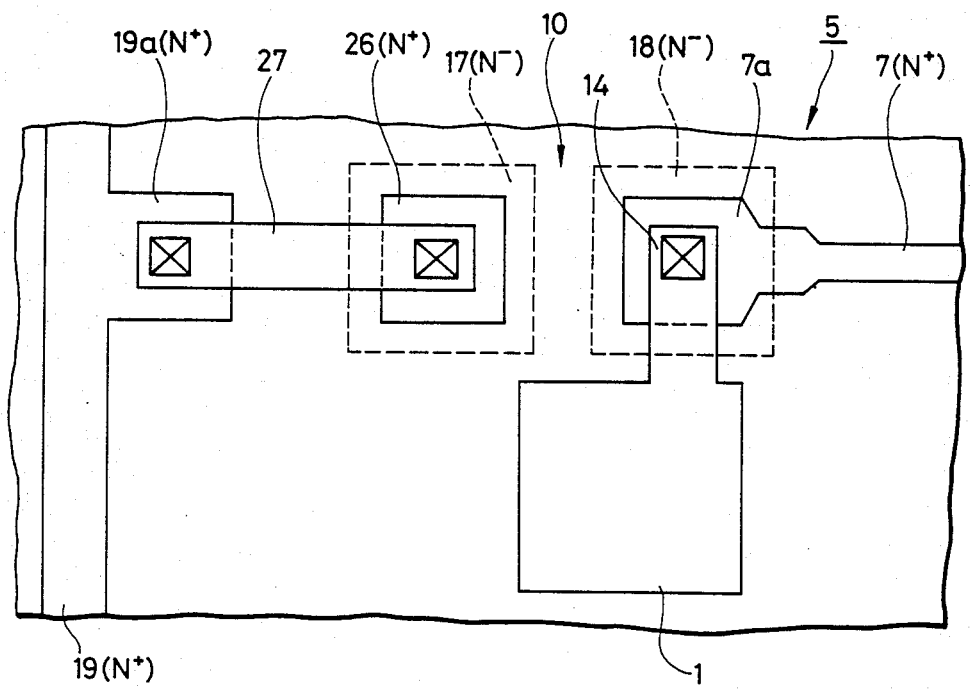
FIG. 9 is a plan view showing still another embodiment of the invention.

For example, the present invention can be implemented as shown in FIGS. 7 through 9.

FIG. 7 is a sectional view corresponding to FIG. 3A, but the N$^-$ type well region 17 shown in FIG. 3A is omitted. In this case, one limiting resistor $R_w$ is deleted, and the current concentration becomes greater on the side of the region 19. Therefore, the breakdown voltage of the lateral transistor itself becomes lower than in the embodiments described above.

FIG. 8 is a sectional view corresponding to FIG. 3A, wherein only the channel stopper 4 in the lateral transistor 10 shown in FIG. 3A is omitted. The operation of the lateral transistor 10 shown in FIG. 8 is substantially the same as that of the lateral transistor of the first embodiment. In particular, there is no difference with respect to a high surge voltage.

FIG. 9 shows another embodiment in which the well region 17 of the lateral transistor 10 is formed independently of the guard ring 19. The well region 17 has the same relation with the well region 18 as in the first embodiment. The collector or emitter region of the lateral transistor 10 comprises the N$^-$ type semiconductor region 17 and the N$^+$ type semiconductor region 26. The region 26 is formed by the same production process as the semiconductor region 24 or as the semiconductor regions 23 and 24. The region 26 is connected to the region 19a by the wiring 27. The wiring 27 is aluminum wiring which is formed simultaneously with the wiring 14, and the like. The effect of this embodiment is the same as that of the first embodiment.

The width of the semiconductor region 7 is reduced stepwise. The area of the contact portion 7a is increased in order to prevent the current concentration. Moreover, since the difference of width between the contact portion 7a and the resistor 3 is great, the width is gradually decreased to prevent the current concentration in the vicinity of the corners.

Figure 10:
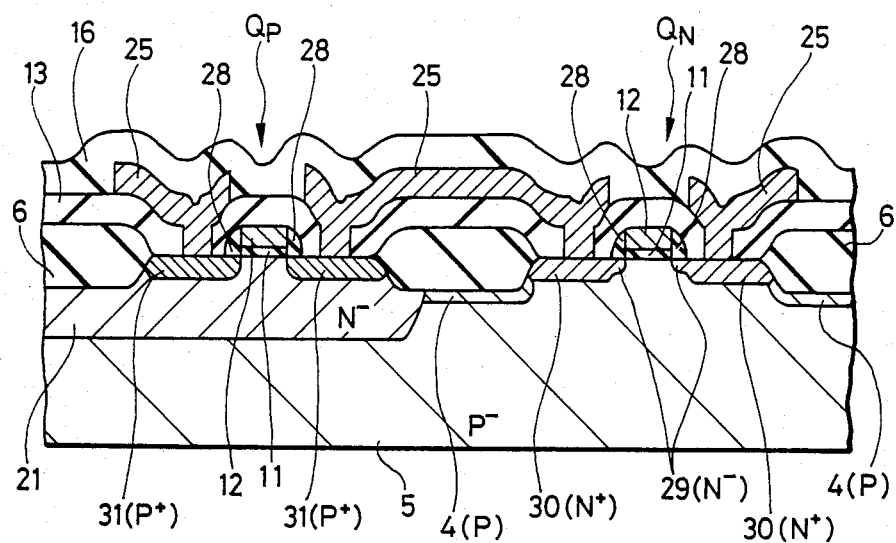
FIG. 10 is a sectional view showing the structure of an internal circuit of a semiconductor device to which the present invention is applied.
Figure 11:
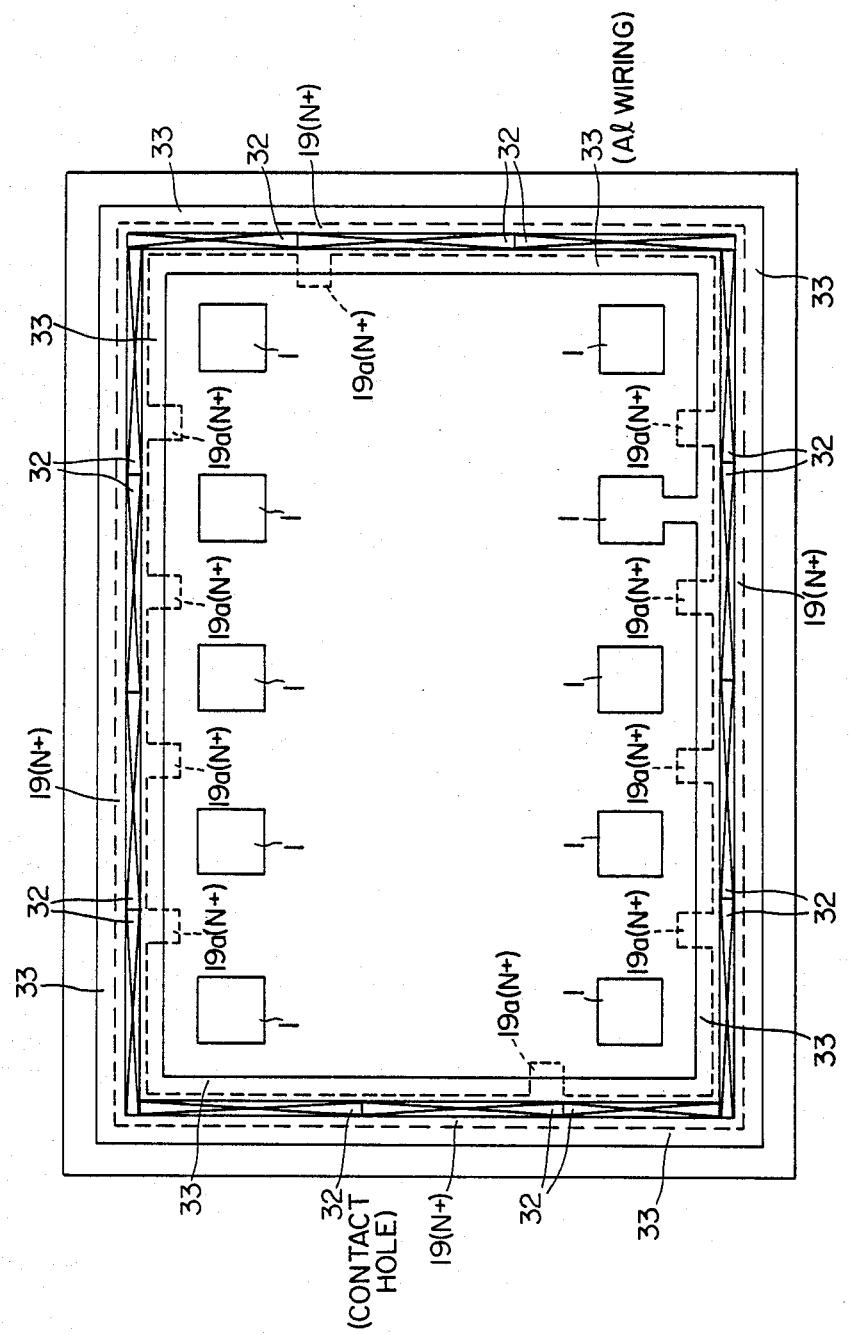
FIG. 11 is a plan view of a semiconductor chip including the present invention showing the layout of the guard ring about the entire chip periphery.

The MOSFET constituting the internal circuit 2 may have a construction as shown in FIG. 10. To prevent the occurrence of hot carriers, N-channel MOSFET $Q_N$ has a LDD (Light Doped Drain) structure. For this reason, side wall insulation films 28 comprising SiO$_2$ are formed on both sides of the gate electrode 12. The semiconductor region 29 is formed by ion implantation of phosphorus by use of the gate electrode 12 as the mask. The semiconductor region 30 is formed by implanting As ions by use of the gate electrode 12 and the side wall insulation films 28 as the mask. The side wall insulation film 28 is formed also on both sides of the gate electrode 12 of P-channel MOSFET $Q_p$. The P$^+$ type semiconductor region 31 is formed by implanting B ions using the gate electrode 12 and the side wall insulation film 28 as the mask. In this case, the semiconductor regions 7 and 8 (and 19) are formed by the same production step as the region 30 having a higher impurity concentration among the regions 29 and 30.

The drain regions as well as the source regions of the N-channel MOSFET constituting the internal circuit 2 are the only regions formed by a process identical with that by which semiconductor regions 7 and 8 are formed, but the invention is not limited to this and other structures may form the source and drain regions.

The protective circuit 9 may have other structures. The resistor 3 may consist of a resistor consisting of polycrystalline silicon except that only its contact portion serves as the semiconductor region 7a. A p-n junction diode may be used in place of MOSFET $Q_D$. Furthermore, other circuit elements may be added as the elements constituting the protective circut 9.

Other semiconductor regions may be used in place of the well regions 17, 18. Since MOSFET 20 is formed inside the well regions, its junction depth is greater and its impurity concentration is lower than those of the resistor element that is formed simultaneously with the source and drain regions of MOSFET. Therefore, those regions which have a greater junction depth and lower impurity concentration than those of the semiconductor regions constituting the semiconductor element, which is directly connected to the bonding pad, can be used in place of the well regions.

The conductivity type of each of the semiconductor regions may be opposite.

The potential of the semiconductor region 19 and that of the substrate 5 are in the floating state and the potentials of the sources of MOSFETs $Q_D$ and $Q_N$ are also under the floating stage close to ground potential, before the semiconductor device is practically mounted to the mounting substrate or before it operates.

The potential of the semiconductor region 19 is preferably equal to the potential of the substrate 5 (e.g. $V_{BB} = -2.0 \sim -3.0$ V) while the semiconductor device is in operation. However, the ground potential $V_{ss}(=0 V)$ of the circuit or the power source voltage $V_{cc}(=5 V)$ may be applied to the semiconductor region 19.

Though the description given above deals with the case where the present invention is applied to the CMOS device, it is obvious that the invention can be applied to a semiconductor device consisting of only N-channel MOSFETs by adding a process for forming the well regions.

Though the description given above illustrates the example in which the switching element (the lateral transistor or MOSFET) is used for the input bonding pad, the present invention can also be applied to bonding pads having other functions such as out put, power source supplying and ground potential supplying. Besides the bonding pad, the present invention can be applied to input-output terminals on a semiconductor chip of a semiconductor device. The invention, is not limited thereto only, and can also be adpated to a MIS-type field-effect transistor in which the gate insulating film is composed of a material other than an oxide film.

What is claimed is:

1. A semiconductor device comprising an internal circuit having a plurality of MISFETs and an input protective circuit which has a resistor and wherein destruction of at least one of said plurality of said MISFETs in said internal circuit is prevented, said semiconductor device comprising:
a semiconductor substrate having a first and a second portion, each having a first conductivity type, in order to form said input protection circuit and said internal circuit, respectively;
a first semiconductor region of a second conductivity type, formed inside said first portion, said first semiconductor region including said resistor, and wherein one end portion of said first semiconductor region is connected directly to an input terminal by an aluminum layer and another end portion of said first semiconductor region is connected to a gate electrode of one of said plurality of MISFETs of said internal circuit;
a second semiconductor region of a second conductivity type, formed inside said first portion, said second semiconductor region being deeper than said first semiconductor region and source and drain regions of said MISFETs in said internal circuit, and having a lower impurity concentration than the source and drain regions of said MISFETs in said internal circuit, said second semiconductor region being in contact with and disposed below said one end portion of said first semiconductor region; and
a third semiconductor region of the second conductivity type, formed inside said first portion, said third semiconductor region being disposed adjacent to said second semiconductor region and separated from said second semiconductor region by a predetermined distance so that said second and third semiconductor regions at said first portion constitute a transistor for preventing the destruction of said at least one of said plurality of MISFETs.

2. A semiconductor device according to claim 1 wherein said second semiconductor region is a well region.

3. A semiconductor device according to claim 2 wherein said third semiconductor region is a well region.

4. A semiconductor device according to claim 1 wherein said third semiconductor region is a well region.

5. A semiconductor device according to claim 1 further comprising a fourth semiconductor region formed inside at a surface of said semiconductor substrate in said first portion, said fourth semiconductor region being a guard ring coupled to said third semiconductor region and extending around an outer periphery of said semiconductor substrate.

6. A semiconductor device according to claim 5 wherein said fourth semiconductor region is of the second conductivity type, and is integral with said third semiconductor region.

7. A semiconductor device according to claim 5 wherein said fourth semiconductor region is separated from said third semiconductor region, and said third and fourth semiconductor regions are connected to each other by wirings.

8. A semiconductor device according to claim 5 wherein said fourth semiconductor region is connected to a fixed potential.

9. A semiconductor device according to claim 1 wherein said input terminal is a bonding pad which extends over at least said semiconductor substrate between said second and third semiconductor regions.

10. A semiconductor device according to claim 1 further comprising an insulation film and a channel stopper region of the first conductivity type, said insulation film overlying the surface of said first portion between said second and third semiconductor regions, and said channel stopper region being disposed below said insulation film and having a higher impurity concentration than said first portion.

11. A semiconductor device comprising an internal circuit having a plurality of P-channel and N-channel MISFETs and an input protective circuit having a resistor and a MISFET connected to a diode form for preventing the destruction of at least a pair of said plurality of MISFETs in said internal circuit, said semiconductor device comprising:
   a semiconductor substrate having a first, second and third portion, said input protective circuit is formed in the first portion having a first conductivity type and said plurality of N-channel MISFETs are formed in the second portion having the first conductivity type and said plurality of P-channel MISFETs are formed in the third portion having a second conductivity type;
   a first semiconductor region of the second conductivity type, formed inside said first portion, said first semiconductor region including said resistor and wherein one end portion of said first semiconductor region is connected directly to an input terminal by an aluminum layer and another end portion of said first semiconductor region is connected to a source or drain region of said MISFET connected in a diode form and gate electrodes of at least a pair of said P-channel and N-channel MISFETs;
   a second semiconductor region of a second conductivity type, formed inside said first portion, said second semiconductor region being deeper than said first semiconductor region and source and drain regions of said N-channel MISFETs in said internal circuit, and having a lower impurity concentration than source and drain regions of said N-channel MISFETs in said internal circuit, said second semiconductor region being in contact with and disposed below said one end portion of said first semiconductor region; and
   a third semiconductor region of the second conductivity type, formed inside at a surface of said first portion, said third semiconductor region being disposed adjacent to said second semiconductor region and separated from said second semiconductor region by a predetermined distance so that said second and third semiconductor regions at said first portion constitute a transistor for preventing destruction of said at least a pair of said plurality of P-channel and N-channel MISFETs.

12. A semiconductor device according to claim 11 wherein the source and drain regions of said N-channel MISFETs provided for the internal circuit are of the second conductivity type and comprising a region of a high impurity concentration and a region of a lower impurity concentration.

13. A semiconductor device according to claim 12, wherein said region of a high impurity concentration is surrounded by said region of a lower impurity concentration.

14. A semiconductor device according to claim 13 wherein said N-channel MISFETs have a double diffused drain structure.

15. A semiconductor device according to claim 12 wherein said N-channel MISFETs of the internal circuit have a lightly doped drain.

16. A semiconductor device according to claim 11 wherein a junction provided for said first portion and said third semiconductor region is forwardly biased by a current occurring when elements comprising said input protective circuit undergo breakdown.

17. A semiconductor device according to claim 16 wherein said input protective circuit comprises said resistor and a MISFET connected in a diode form, and said breakdown is a surface breakdown of said MISFET in the diode form or a breakdown of said first semiconductor region provided for said resistor.

18. A semiconductor device according to claim 15, wherein each of said N-channel MISFETs provided for the internal circuit have a side wall insulation film on both sides of gate electrode and said region of a lower impurity concentration is formed by use of the gate electrode as a mask and said region of a high impurity concentration is formed by use of the gate electrode and the insulation film as a mask.

19. A semiconductor device according to claim 13 wherein said region of a high impurity concentration and said region of a lower inpurity concentration contain implanted arsenic ions and phosphorus ions, respectively.

20. A semiconductor device according to claim 18 wherein said region of a high impurity concentration and said region of a lower impurity concentration contain implanted arsenic ions and phosphorus ions, respectively.

21. A semiconductor device according to claim 17 wherein source and drain regions of said MISFET connected in diode form are of the second conductivity type and comprise a region of a high impurity concentration.

22. A semiconductor device according to claim 18 wherein source and drain regions of said MISFET connected in diode form are of the second conductivity type and comprise a region of a high impurity concentration.

23. A semiconductor device according to claim 11, wherein said P-channel MISFETS provided for an internal circuit are also formed in a fourth semiconductor region of second conductivity type and said fourth semiconductor region is simultaneously formed with said second and third semiconductor regions.

24. A semiconductor device according to claim 23, wherein said fourth semiconductor region is a well region.

25. A semiconductor device according to claim 11, wherein said second semiconductor region is a well region.

26. A semiconductor device according to claim 11, wherein said third semiconductor region is a well region.

27. A semiconductor device according to claim 11, further comprising a fourth semiconductor region formed inside said semiconductor substrate, said fourth semiconductor region being a guard ring coupled to said third semiconductor region and being disposed on a surface of said semiconductor substrate and extending around an outer periphery of said semiconductor substrate.

28. A semiconductor device according to claim 27, wherein said fourth semiconductor region is of the second conductivity type, and is integral with said third semiconductor region.

29. A semiconductor device according to claim 28, wherein said fourth semiconductor region is separated from said third semiconductor region, and said third and fourth semiconductor regions are connected to each other by wirings.

30. A semiconductor device according to claim 28 wherein said fourth semiconductor region is connected to a fixed potential.

31. A semiconductor device according to claim 11 wherein said input terminal is a bonding pad which extends over at least said semiconductor substrate between said second and third semiconductor regions.

32. A semiconductor device according to claim 15, wherein said P-channel MISFETs have a single drain structure.

33. A semiconductor device according to claim 14, wherein said P-channel MISFETs have a single drain structure.

* * * * *